United States Patent [19]
Kim

[11] Patent Number: 6,105,847
[45] Date of Patent: Aug. 22, 2000

[54] NOZZLE STRUCTURE OF REPAIR APPARATUS FOR SEMICONDUCTOR PACKAGE

[75] Inventor: Young-Gon Kim, Cheongju, Rep. of Korea

[73] Assignee: LG Semicon Co., Ltd., Choongcheongbuk-Do, Rep. of Korea

[21] Appl. No.: 09/151,702

[22] Filed: Sep. 11, 1998

[30] Foreign Application Priority Data

Sep. 12, 1997 [KR] Rep. of Korea ............... 97-47076

[51] Int. Cl.[7] .................. B23K 1/00; B23K 5/00
[52] U.S. Cl. ............ 228/6.2; 228/6.2; 228/49.5
[58] Field of Search .............. 228/49.5, 19, 6.2, 228/191, 264

[56] References Cited

U.S. PATENT DOCUMENTS

| | | | |
|---|---|---|---|
| 3,813,023 | 5/1974 | Auray et al. | 228/19 |
| 4,528,746 | 7/1985 | Yoshimura | 29/743 |
| 4,552,300 | 11/1985 | Zovko et al. | 228/20 |
| 4,659,004 | 4/1987 | Fridman | 228/6.2 |
| 4,752,025 | 6/1988 | Stach et al. | 228/9 |
| 4,767,047 | 8/1988 | Todd et al. | 228/6.2 |
| 4,787,548 | 11/1988 | Abbognaro et al. | 228/6.2 |
| 5,263,620 | 11/1993 | Hernandez et al. | 225/1 |
| 5,419,481 | 5/1995 | Lasto et al. | 228/6.2 |
| 5,560,531 | 10/1996 | Ruzkowski | 228/19 |
| 5,579,979 | 12/1996 | Kurpiela | 228/6.2 |
| 5,785,237 | 7/1998 | Lasto et al. | 228/180.22 |
| 5,810,241 | 9/1998 | Gabriel et al. | 228/6.2 |

*Primary Examiner*—Patrick Ryan
*Assistant Examiner*—Lynne Edmondson

[57] ABSTRACT

A nozzle structure of a repair apparatus for a semiconductor package includes a funnel holder connected to a repair apparatus, a cylinder extended downwardly from the funnel holder, a vacuum tube provided along an axis of the cylinder, a vacuum absorption body housing the vacuum tube therein, and a pair of exhaust guide wall clips. A lower portion of the cylinder is compressed from four sides thereof so as to form a rectangular ending thereof which has first through fourth side walls. The vacuum absorption body is positioned between the first and third side walls. Each of the exhaust side walls is fixed to corresponding side edge lines of the first and third side walls, wherein the first and third side walls are identical in height and facing each other, the second and fourth side walls are identical in height and facing each other, and the first and third side walls are shorter than the second and fourth side walls in height.

14 Claims, 5 Drawing Sheets

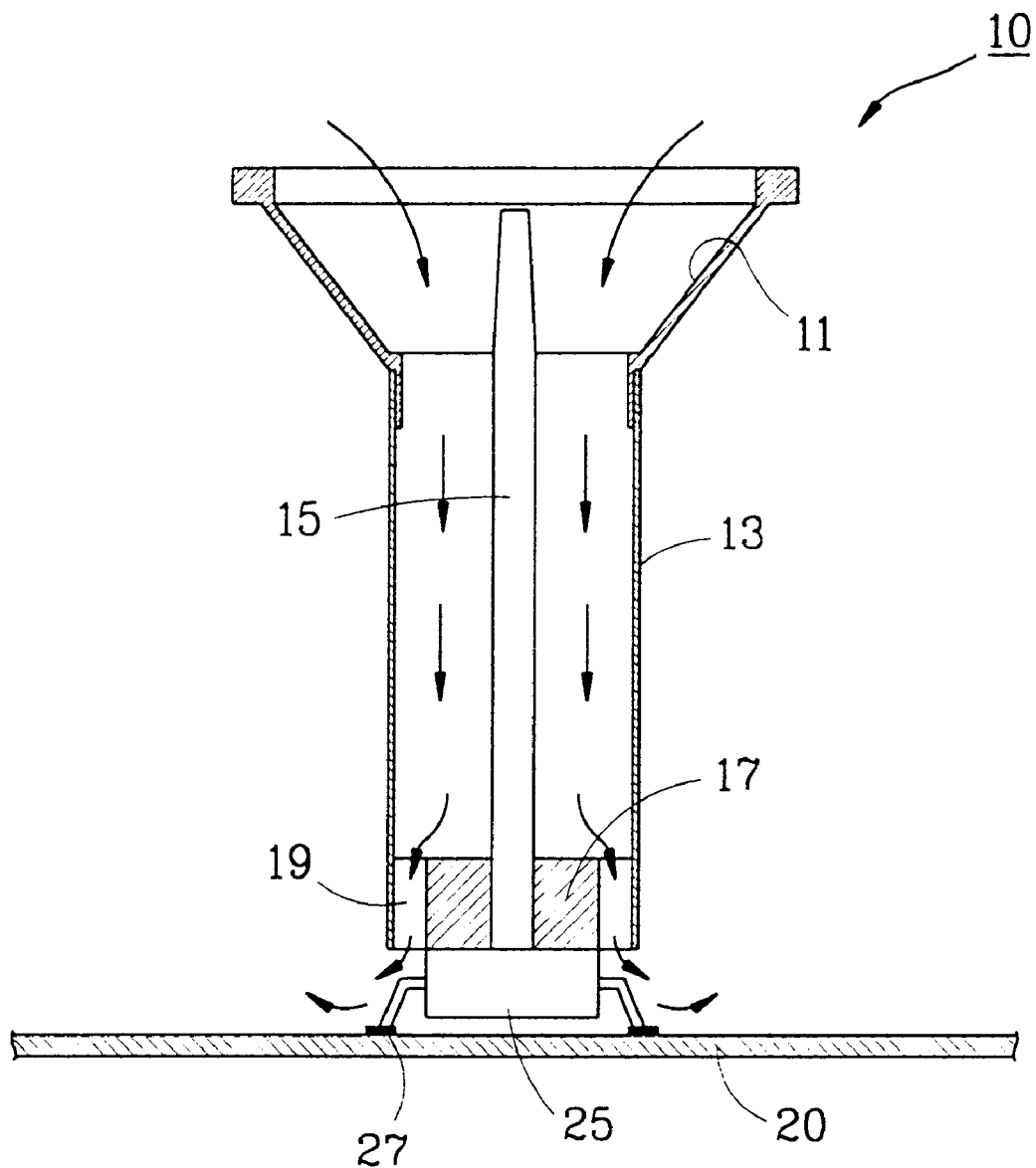

NOZZLE STRUCTURE OF REPAIR APPARATUS FOR SEMICONDUCTOR PACKAGE

BACKGROUND OF THE INVENTION

1. Field of the Invention

The present invention relates to a nozzle structure of a repair apparatus for a semiconductor package, and more particularly to an improved nozzle structure of a repair apparatus for a semiconductor package, wherein the flow of a hot air output from the repair apparatus is induced toward solder joints provided beneath the bottom surface of a bottom lead semiconductor package, thereby effectively melting the solder joints that connect the semiconductor package to a printed circuit board.

2. Description of the Prior Art

In general, a semiconductor package is mounted on a printed circuit board by solder joints. When the semiconductor package is or becomes defective, it must be detached and removed from the printed circuit board using a repair nozzle connected to a repair apparatus.

FIG. 1 is a plan view illustrating a conventional repair nozzle 10, and FIG. 2 is a cross-sectional view taken along line II–II' in FIG. 1. As shown therein, the repair nozzle 10 includes: a funnel holder 11 connected to a repair apparatus (not shown) that generates and provides hot air; a cylinder 13 extending downwardly from the holder 11; a vacuum tube 15 positioned along the axis of the cylinder 13; and a vacuum absorption body 17 fixed in a lower portion of the cylinder 13. A plurality of air vents 19 are formed in and along the sides of the vacuum absorption body 17.

With reference to FIG. 3, the operation of the conventional repair nozzle 10 will now be described.

First, the funnel holder 11 of the repair nozzle 10 shown in FIG. 1 is connected to a hot air outlet (not shown) of the repair apparatus (not shown), and the vacuum absorption body 17 can be placed on the surface of a QFP (Quad Flat Package) 25 mounted on a printed circuit board 20. The hot air generated from the repair apparatus (not shown) is supplied through the funnel holder 11 into the cylinder 13, and guided through the air vents 19 formed in and along the sides of the vacuum absorption body 17, melting target solder joints 27 connecting the QFP 25 and the printed circuit board 20. The hot air that melted the solder joints 27 is externally discharged.

When the solder joints 27 are completely melted, the vacuum absorption body 17 is closely adhered to the upper surface of the package 25. That is, after hot air is sucked in through the vacuum tube 15 to tightly absorb the package 25, the repair nozzle 10 is moved upward. Accordingly, the package 25 becomes detached from the printed circuit board 20. The hot air flow is illustrated by arrows (→) in FIG. 3.

The thusly operated conventional repair nozzle 10 is advantageous when used to detach a semiconductor package from a printed circuit board, wherein its outer leads are externally protruded extending from the sides of he package body, as witnessed in SOP (Small Out-Line Package), SOJ (Small Out-Line J-Leaded Package), QFP (Quad Flat Package), and the like.

However, because of the nozzle structure, the conventional repair nozzle is less capable of detaching a semiconductor package having outer leads that are formed extending from the package bottom from a printed circuit board. That is, when a BLP (Bottom Lead Plastic) package is mounted on a printed circuit board, it has been difficult to appropriately melt the concealed solder joints by use of the conventional repair nozzle, which induces the hot air to only flow along the sides of the package because its solder joints are concealed underneath the package body.

SUMMARY OF THE INVENTION

It is an object of the present invention to provide an improved repair nozzle for more effectively detaching a bottom-leaded semiconductor package that has outer leads exposed from the bottom surface thereof from a printed circuit board upon which that semiconductor package is mounted.

To achieve the above-described object, there is provided a repair nozzle which includes a funnel holder connected to a repair apparatus, a cylinder extended downwardly from the funnel holder, wherein a lower portion of the cylinder is compressed from four sides thereof so as to form a rectangular ending thereof which has a first through fourth side walls, a vacuum tube provided along an axis of the cylinder, a vacuum absorption body housing the vacuum tube therein and fixed between the first and third side walls, and a pair of exhaust guide wall clips, each of which is fixed in contact with corresponding side edge lines of the first and third side walls, wherein the first and third side walls are identical in height and facing each other, the second and fourth side walls are identical in height and facing each other, and the first and third side walls are shorter than the second and fourth side walls in height.

In addition, there is provided a nozzle structure for a semiconductor package repair apparatus comprising a heating chamber having side walls, a vacuum chamber positioned within the heating chamber, an absorption body positioned within the heating chamber and around the vacuum chamber at an end thereof, at least one exhaust guide wall positioned outside the side walls of the heating chamber and extending beyond a bottom of a corresponding portion of the side walls of the heating chamber. A bottom of the exhaust guide wall is aligned with a bottom of the portion of the side walls of the heating chamber corresponding to the exhaust guide wall.

The bottom surface of the vacuum absorption body is aligned with the bottom of the portion of the side walls of the heating chamber not corresponding to the exhaust guide wall. The absorption body extends to contact a portion of the side walls of the heating chamber corresponding to the exhaust guide wall, not extending to contact a portion of the side walls of the heating chamber other than the portion corresponding to the exhaust side wall. The exhaust guide wall extends beyond the portion of the side walls of the heating chamber corresponding to the exhaust guide wall by a distance that is based on the height of a semiconductor package to be repaired. A second exhaust guide wall may also be positioned outside the side walls of the heating chamber having features similar to the first exhaust guide wall. The vacuum absorption body has a recess in a lower portion thereof, the vacuum chamber being exposed by the recess. An air vent may be positioned between the vacuum absorption body and the portions of the side walls of the heating chamber not corresponding to the exhaust guide wall.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become better understood with reference to the accompanying drawings, which are given only by way of illustration and which are therefore not limitative of the present invention, and wherein:

FIG. 3 is a cross-sectional view of the conventional repair nozzle for detaching a semiconductor package mounted on a printed circuit board;

DETAILED DESCRIPTION OF THE PREFERRED EMBODIMENT

With reference to the accompanying drawings, a nozzle structure of a repair apparatus for a semiconductor package according to the preferred embodiment of the present invention is described hereinafter.

Figure 1:
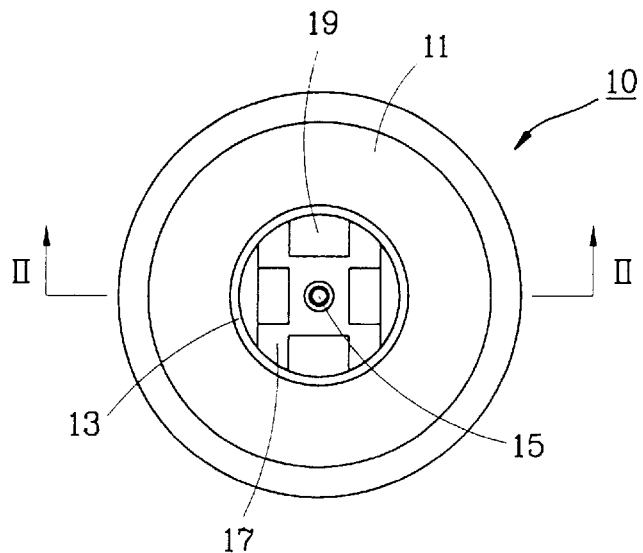
FIG. 1 is a plan view of a conventional repair nozzle.
Figure 2:
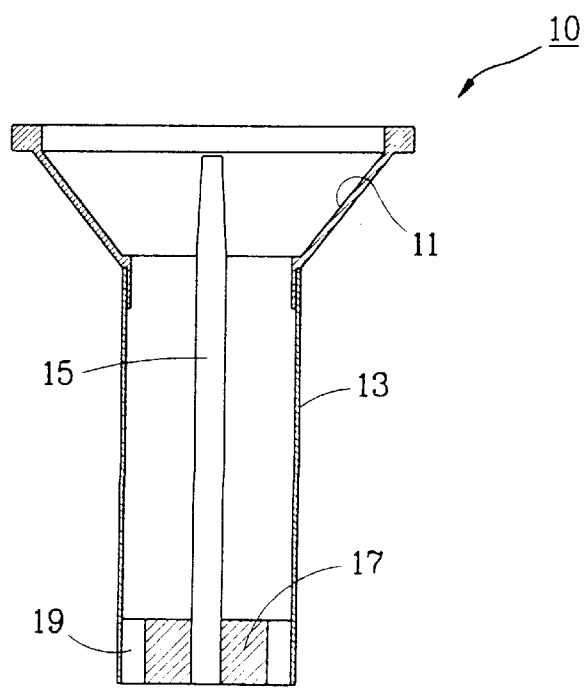
FIG. 2 is a cross-sectional view taken along line II—II in FIG. 1.
Figure 4A:
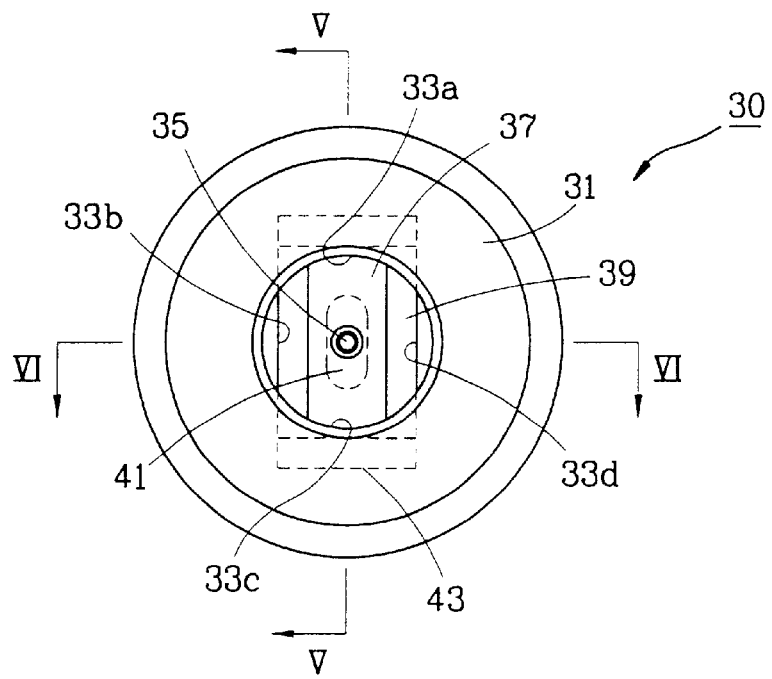
FIG. 4A is a plan view of a repair nozzle according to the present invention.
Figure 5:
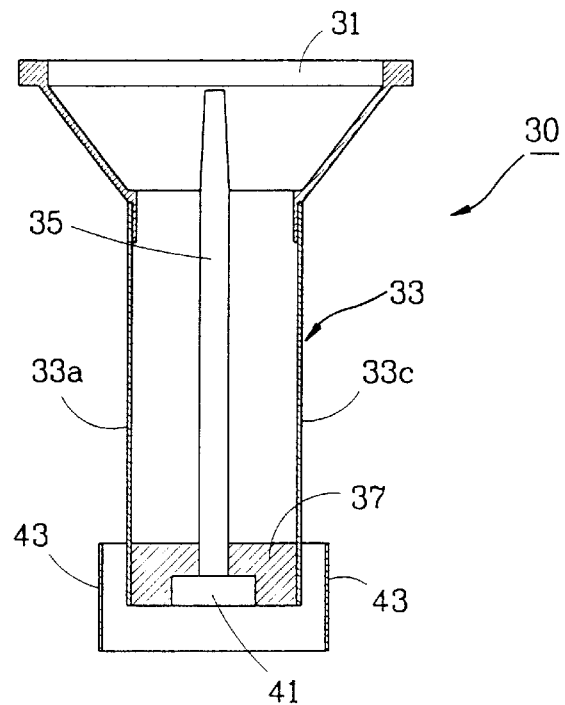
FIG. 5 is a cross-sectional view taken along line V—V in FIG. 4A.
Figure 6:
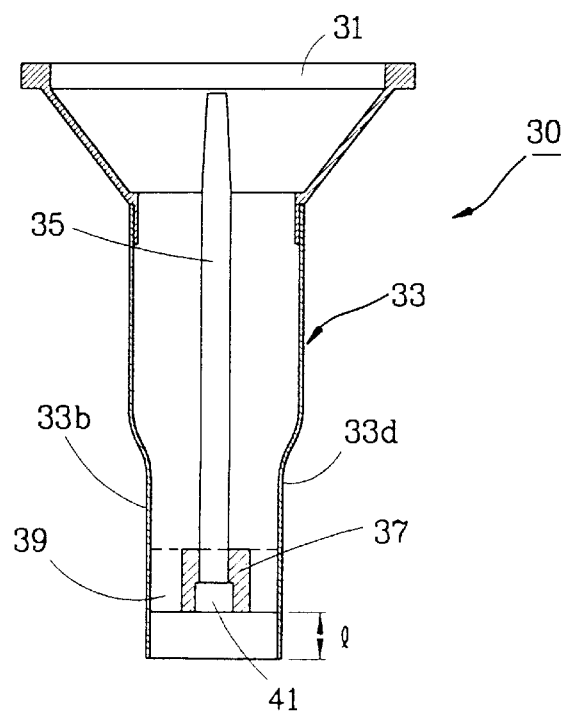
FIG. 6 is a cross-sectional view taken along line VI—VI in FIG. 4A.

FIG. 4A is a plan view of a repair nozzle according to the present invention. FIG. 5 is a cross-sectional view taken along line V—V in FIG. 4A, and FIG. 6 is a cross-sectional view taken along line VI—VI in FIG. 4A.

As shown therein, the repair nozzle 30 includes a funnel holder (connection member) 31 that is connected to a repair apparatus (not shown), and a cylinder 33 extended downwardly from the funnel holder 31. A lower portion of the cylinder 33 is compressed to a certain degree from four sides thereof, effectively forming a rectangle having a first side wall 33a, a second side wall 33b, a third side wall 33c, and a fourth side wall 33d. The first and third side walls 33a and 33c face each other, and the second and fourth side walls 33b and 33d also face each other. A vacuum tube 35 is installed along the axis of the cylinder 33. A vacuum absorption body 37 is fixed between the first and third side walls 33a and 33c of the lower portion of the cylinder 33. The vacuum tube 35 is appropriately inserted into the vacuum absorption body 37.

Figure 4B:
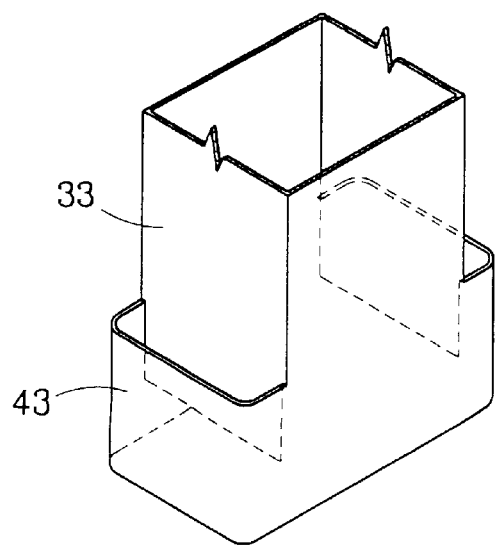
FIG. 4B is a three-dimensional view of the lower portion of the cylinder and the exhaust guide wall clip of the repair nozzle.

A pair of parallel sides of the vacuum absorption body 37 abut the inner sides of the first and third side walls 33a and 33c. A pair of air vents 39 are respectively formed between the other pair of parallel sides of the vacuum absorption body 37 and the inner sides of the second and fourth side walls 33b and 33d. A recess 41 is formed in a central bottom portion of the vacuum absorption body 37 so as to expose a lower end of the vacuum tube 35 therethrough. The bottom of the vacuum absorption body 37 and the respective lower tips of the first and third side walls 33a and 33c are linearly aligned in the same level. An exhaust guide wall clip 43 is formed as a single body having a rectangular shape with four side walls in an outside of a lower portion of the cylinder 33. Two of the side walls of the exhaust guide wall clip 43 which face each other are respectively separated from an outside of the first and third side walls 33a and 33c by a predetermined space. The other two side walls of the exhaust guide wall clip 43 which face each other are connected with the second and fourth side walls 33b and 33d, respectively. FIG. 4B provides a three-dimensional view of the interrelationship between the side walls of the lower portion of the cylinder 33 and the exhaust guide wall clip 43.

The height of the first side wall 33a is identical to that of the third side wall 33c. The respective heights of the second and fourth side walls 33b and 33d are also identical to each other. Meanwhile, the height of the first side wall 33a or the third side wall 33c is formed a length 1 shorter than that of the second side wall 33b or the fourth side wall 33d. The height difference 1 between the side walls is preferably identical to the height of a semiconductor package applicable to the repair nozzle according to the present invention. Also, the lower tip of each of the exhaust guide wall clips 43 and the respective lower tips of the second and fourth side walls 33b, 33d are linearly aligned in the same level.

The operation of the repair nozzle according to the present invention will now be explained with reference to FIGS. 7 and 8.

Figure 7:
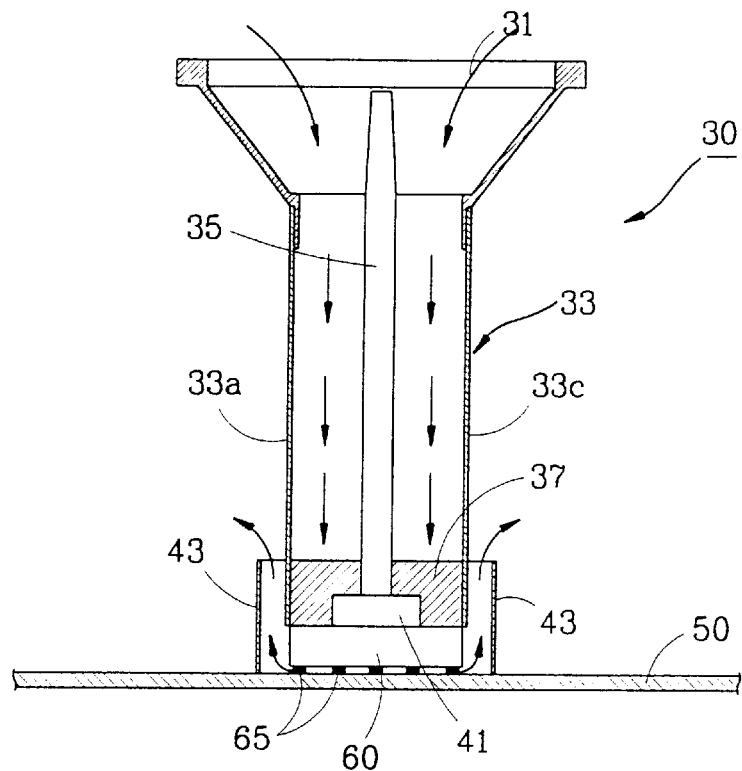
FIG. 7 is a cross-sectional view of the repair nozzle according to the present invention for detaching a semiconductor package mounted on a printed circuit board.
Figure 8:
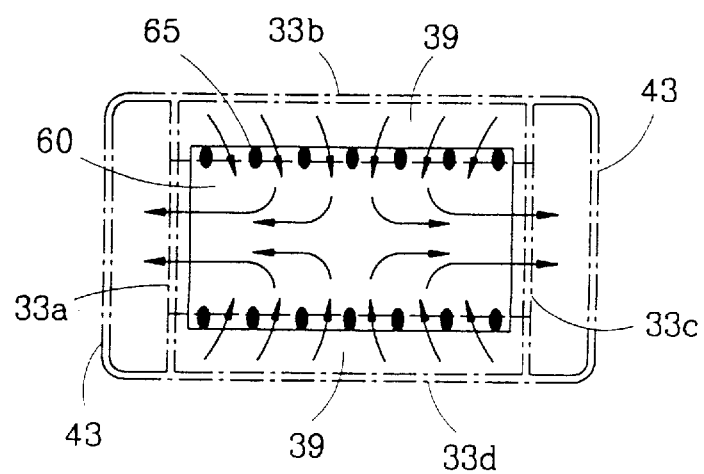
FIG. 8 is a bottom view illustrating the flow of a hot air by the repair nozzle according to the present invention.

As shown in FIG. 7, a BLP package 60 is mounted by solder joints 65 on a printed circuit board 50. In order to detach the BLP package 60 from the printed circuit board 50, the solder joints 65 should be melted. The process for detaching the BLP package 60 from the printed circuit board by use of the repair nozzle 30 will now be described, wherein the flow of a hot air is illustrated by arrows (→) in FIGS. 7 and 8.

First, the funnel holder 31 of the repair nozzle 30 is connected to a hot air outlet (not shown) of a repair apparatus (not shown). The bottom surface of the vacuum absorption body 37 is aligned on the upper surface of the BLP package 60 mounted on the printed circuit board 50 by the solder joints 65. At this time, the respective lower tips of the second side wall 33b and the fourth side wall 33d are abutted to the upper surface of the printed circuit board 50.

The hot air generated from the repair apparatus (not shown) flows through the funnel holder 31 into the cylinder 33. The thusly supplied hot air passes through the air vents 39 formed in the sides of the vacuum absorption body 37 and is guided inside and along the second side wall 33b and the fourth side wall 33d to the upper surface of the printed circuit board 50, and then as shown in FIG. 8, the hot air continues flowing down along each side of the BLP package 60 for thereby melting the solder joints 65 beneath the package 60. The hot air that passed through the solder joints 65 flows up along the exhaust guide wall clip 43 and is externally discharged.

When the solder joints 65 are completely melted by the hot air, vacuum pressure is applied through the vacuum tube 35 and the recess 41 to engage the upper surface of the package 60. Then, using suction, the package 60 is detached from the printed circuit board 50 by moving the repair nozzle 30 upward.

As described above, in order to detach a BLP package having outer leads formed on its bottom surface, which are mounted on a printed circuit board by solder joints, the nozzle repair according to the present invention precisely induces the hot air flow toward a direction below the package while preventing its leakage, for thereby easily melting he solder joints concealed beneath a failing or otherwise undesirable package.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A nozzle structure of a repair apparatus for a semiconductor package, comprising:

a funnel holder connected to a repair apparatus;

a nozzle having a cylindrical upper portion extended downwardly from the funnel holder and a rectangular lower portion defined by first, second, third and fourth side walls, wherein the first and third side walls are identical in height and facing each other, the second and fourth side walls are identical in height and facing each other, and the first and third side walls are shorter in height than the second and fourth side walls;

a vacuum tube provided within the cylinder in an axial direction;

a vacuum absorption body fixed between the first and third side walls of said nozzle so as to obstruct incoming gas flow where said first and third sidewalls overlap said vacuum absorption body, respectively, and positioned around the vacuum tube at an end thereof; and an exhaust guide wall clip having a rectangular shape with four side walls and positioned in an outside of a lower portion of the nozzle, two of the side walls facing each other and each being separated from an outside of the first and third side walls by a predetermined space, the other two side walls facing each other and each being connected with the second and fourth side walls, respectively.

2. The nozzle structure recited by claim 1, further comprising:

an air vent positioned adjacent a first side of the vacuum absorption body and inside the second side wall, and adjacent a second side of the vacuum absorption body and inside the fourth side wall, where the first side of the vacuum absorption body is positioned opposite the second side of the vacuum absorption body.

3. The nozzle structure recited by claim 1, wherein a recess is formed in a central bottom surface of the vacuum absorption body so as to expose a lower end of the vacuum tube therethrough.

4. The nozzle structure recited by claim 1, wherein a height difference between the side walls is identical to a height of a target semiconductor package to be removed.

5. The nozzle structure recited by claim 1, wherein the bottom surface of the vacuum absorption body, and respective lower tips of the first and third side walls are linearly aligned at a same level.

6. The nozzle structure recited by claim 1, wherein respective lower tips of the exhaust guide wall clips and of the second and fourth side walls are linearly aligned at a same level.

7. A nozzle structure for a semiconductor package repair apparatus, comprising:

a heating chamber having side walls;

a vacuum chamber positioned within the heating chamber;

an absorption body positioned within the heating chamber and around the vacuum chamber at an end thereof, wherein the absorption body extends to contact a portion of the side walls of the heating chamber corresponding to the exhaust guide wall so as to obstruct incoming gas flow where said side walls of said heating chamber overlap said absorption body; and at least one exhaust guide wall positioned outside the side walls of the heating chamber and extending beyond a bottom of a corresponding portion of the side walls of the heating chamber.

8. The nozzle structure recited by claim 7, wherein a bottom of the exhaust guide wall is aligned with a bottom of the portion of the side walls of the heating chamber corresponding to the exhaust guide wall.

9. The nozzle structure recited by claim 7, wherein the absorption body does not extend to contact a portion of the side walls of the heating chamber not corresponding to the exhaust side wall.

10. The nozzle structure recited by claim 7, wherein two exhaust guide walls are positioned outside the side walls of the heating chamber and extending beyond corresponding portions of the side walls of the heating chamber, a bottom of each exhaust guide wall being aligned with a bottom portion of each portion of the side walls of the heating chamber not corresponding to the exhaust guide walls, the absorption body extending to contact the each portion of the side walls of the heating chamber corresponding to the exhaust guide walls, the absorption body not extending to contact the portions of the side walls of the heating chamber not corresponding to the exhaust guide walls.

11. The nozzle structure recited by claim 7, wherein the exhaust guide wall extends beyond the portion of the side walls of the heating chamber corresponding to the exhaust guide wall by a distance that is based on the height of a semiconductor package to be repaired.

12. The nozzle structure recited by claim 7, wherein the vacuum absorption body has a recess in a lower portion thereof, the vacuum chamber being exposed by the recess.

13. The nozzle structure recited by claim 7, further comprising an air vent is positioned between the vacuum absorption body and the portions of the side walls of the heating chamber not corresponding to the exhaust guide wall.

14. The nozzle structure recited by claim 7, wherein the bottom surface of the vacuum absorption body is aligned with the bottom of the portion of the side walls of the heating chamber not corresponding to the exhaust guide wall.

* * * * *